US005523965A

United States Patent [19]
Kaga et al.

[11] Patent Number: 5,523,965
[45] Date of Patent: Jun. 4, 1996

[54] SEMICONDUCTOR MEMORY DEVICE AND METHOD OF MANUFACTURING SAME

[75] Inventors: Toru Kaga, Hachioji; Shoji Shukuri, Koganei; Masahiro Moniwa, Hannou; Dai Hisamoto, Kokubunji, all of Japan

[73] Assignee: Hitachi, Ltd., Tokyo, Japan

[21] Appl. No.: 361,958

[22] Filed: Dec. 22, 1994

[30] Foreign Application Priority Data

Dec. 27, 1993 [JP] Japan .................................. 5-331203

[51] Int. Cl.$^6$ .................................................. G11C 11/24
[52] U.S. Cl. ............................................. 365/149; 365/51
[58] Field of Search .............................. 365/51, 149, 150, 365/52, 53, 63

[56] References Cited

U.S. PATENT DOCUMENTS 5,463,577  10/1995  Oowaki et al. ..................... 365/149

OTHER PUBLICATIONS

Spreaded–Vertical–Capacitor Cell (SVC) For Beyond 64MBit DRAMs by N. Matsuo, Y. Nakata, H. Ogawa, T. Yabu, S. Matsumoto, M. Sasago, K. Hashimoto, and S. Okada for Semiconductor Research Center, Matsushita Electric Industrial Co., Ltd., Moriguchi, Osaka 570, Japan.

*Primary Examiner*—Terrell W. Fears
*Attorney, Agent, or Firm*—Antonelli, Terry, Stout & Kraus

[57] ABSTRACT

Short and long sides of each of capacitors held by a semiconductor memory device are respectively made shorter and longer so that the capacitors are laid over memory cell regions adjacent to each other. Thus, large capacity type capacitors whose circumferential length increases and total capacitor area greatly increases can be obtained without so increasing plane areas of the capacitors.

19 Claims, 19 Drawing Sheets

SEMICONDUCTOR MEMORY DEVICE AND METHOD OF MANUFACTURING SAME

BACKGROUND OF THE INVENTION

The present invention relates to a semiconductor memory device and a method of manufacturing the semiconductor memory device, and more specifically to a MOS type semiconductor memory device such as a DRAM (Dynamic Random Access Memory) or the like, which is capable of being brought into high density and a method of manufacturing the semiconductor memory device.

Many endeavors have heretofore been carried out to improve the density of integration of a semiconductor memory device as has already been known. In a DRAM cell which has been proposed in Japanese Patent Application No. 2-115642, for example, three-dimensional capacitors laid over memory cell regions, whose plane areas and circumferential lengths have been reduced to about ⅜ and about ⅔ respectively, have been formed.

In the prior art, however, the total area of the capacitors is about three to four times the area of each memory cell and capacitors each having a surface area greater than such an area are not yet obtained. Therefore, the area of a capacitor is greatly reduced each time the generation is changed from one to another in the case of a DRAM in which the area of each memory cell is reduced to about ⅓ for each generation. It has also been hard to stably activate the DRAM without being disturbed by noise such as α-rays from other region.

There has therefore been a strong demand for a semiconductor memory device capable of providing a less reduction in the total area of the capacitors and keeping the total area of capacitors great even when the area of each of memory cells is reduced.

SUMMARY OF THE INVENTION

An object of the present invention is to provide a semiconductor memory device capable of solving problems involved in the prior art and provided with capacitors each having a surface area extremely larger than the area of each of memory cells and to a method of manufacturing the semiconductor memory device.

Another object of the present invention is to provide a semiconductor memory device capable of performing a stable operation without being disturbed by noise such as α-rays from other region and to a method of manufacturing the semiconductor memory device.

The present invention is constructed in the following manner to achieve the above objects. The length of a short side of each of the capacitors is made shorter, e.g., reduced to about ½ and the length of a long side thereof is made longer. In this condition, the capacitors are provided so as to lay over other memory cell regions disposed adjacent to each other. Thus, a capacitor (whose circumferential length is about two times the conventional length, for example), which is sufficiently long in circumferential length, is formed without so increasing a predetermined plane area of the capacitor.

The circumferential length of the capacitor is greatly increased by shortening the length of the short side of the capacitor and increasing the length of the long side thereof. When the short side is reduced to ½ and the long side is increased to three times, for example, an increase in plane area reaches about 1.5 times, whereas an increase in circumferential length reaches about two times. Further, when the short side of the capacitor is reduced to ½ and the long side thereof is increased to two times, the plane area remains unchanged but the circumferential length increases up to about 1.5 times. In either case, an increase in circumferential length is much greater than an increase in plane area.

Namely, if the short side of each of the capacitors is reduced and the long side thereof is made longer, the length of the circumference can be greatly increased without so increasing the plane area of each of the capacitors and correspondingly the area of each capacitor can be made greater.

Namely, as is already known, each of capacitors used for the present DRAM is three dimensional in structure and the height of each capacitor is greater than dimensions of a portion whose size is minimized, for example, the width of a word line or a data line. Further, a wall-like portion of a peripheral edge or circumferential portion is often used as a capacitor. Therefore, the rate of the area of the wall-like portion to the total area of the capacitors is made larger. Thus, in the case that the long side of the capacitor is made longer even if the short side thereof is decreased, and the capacitor is laid over each of memory cell regions provided adjacent to each other, the length of the circumferential portion of the capacitor increases so that the area of the wall-like portion of the circumferential portion is greatly increased. As a result, the area of the capacitor is made so greater. Even in the case of a capacitor having a simple island-like structure, the total capacitor area which is about three times the area of each memory cell, can be easily realized.

Further, when a wall-like capacitor electrode whose part protrudes upward or is bent, is used and both sides of the electrode are used as a capacitor, the total capacitor area, which is six times or more the memory cell area, can be materialized without a change in height of the capacitor. As a result, a semiconductor memory device can be obtained which has a sufficient large capacitance, resists noise such as α-rays from other region and has high reliability.

As is apparent from FIG. 2a, the ratio between the length of the short side of a capacitor rectangular in plane shape and the long side thereof was conventionally set to 1:2. The present invention is intended to realize a semiconductor memory device capable of providing an extremely large total area of a capacitor and high reliability by setting the above ratio to a ratio greater than the conventional ratio of 1:2. Though the ratio between the lengths of the short and long sides is suitably selected in the present invention, a desirable result can be obtained by selecting the ratio from ratios ranged between 1:5 and 1:56. If the above ratio is smaller than 1:5, an effect for increasing the total area of capacitors cannot be obtained. The more the above ratio increases, the more the effect of increasing the total area of the capacitors is enhanced. However, if the above ratio is so great, the length of the short side is excessively reduced. It is therefore hard to form such an extremely small short side with high accuracy due to the limit of fine processing. Owing to the above reason, the maximum ratio is about 1:56.

If the lengths of the short and long sides of the capacitor are respectively set to 0.25 and 14 in this case, the plane area almost remains unchanged but the length of the circumference becomes about 5 times as compared with the conventional example shown in FIG. 3a in which both lengths are respectively 1 and 2. Further, an increase in peripheral edge length becomes so greater as compared with an increase in plane area.

It is needless to say that the present invention can be applied not only to a planar type capacitor but also to various capacitors having three-dimensional structures, such as a "trench capacitor" formed on an inner surface of a groove (trench) defined in a semiconductor substrate and a "stacked capacitor" formed by stacking electrodes and insulators on a gate electrode and an insulator for the isolation as well as on an exposed surface of the semiconductor substrate, and the like. According to the present invention, since the increase in the peripheral edge length is so greater than the increase in the plane area, the effect of increasing the area of each capacitor becomes so great where the present invention is applied to the capacitors three-dimensional in structure such as the trench capacitor, the stacked capacitor, etc. as compared with the case where the present invention is applied to the aforementioned planar type capacitor which has heretofore been used in general.

DETAILED DESCRIPTION OF THE PREFERRED EMBODIMENTS

Example 1

Figure 1A:
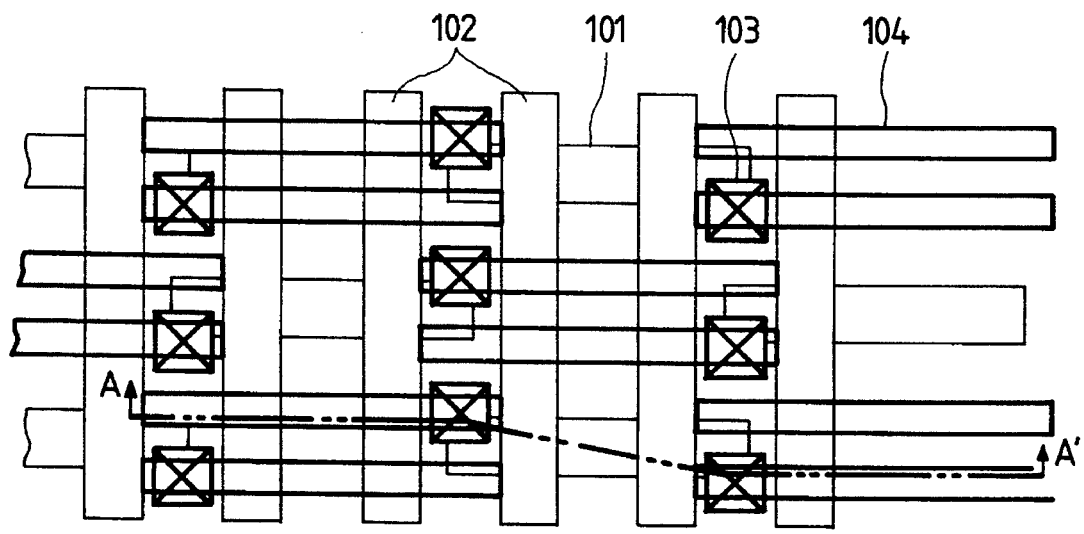
FIGS. 1a and 1b are respectively views for describing a plane layout of a first embodiment.

A first example of the present invention will be described below with reference to FIGS. 1a and 1b. FIG. 1b shows a layout (plane layout) of each of DRAM cells, which is provided with active regions 101, word lines 102 each forming a gate electrode of a MOSFET (Metal Oxide Semiconductor Field Effect Transistor), contact holes 103 each of which is used to electrically connect the active region 101 and its corresponding capacitor 104 to each other, an opposed electrode (plate) 105 of the capacitors 104, and contact holes 106 each of which is used to electrically connect a data line 107 and its corresponding active region to each other. FIG. 1b illustrates the layout of the data lines 107, the plate 105 and the contact holes 106. The memory cell is provided with the data lines 107 disposed on their corresponding capacitors 104 and has a layout of a folded data line type (also called "two-line intersection type").

Capacitors 104 held by two cells which are provided adjacent to each other along the longitudinal direction of the data line 107 and do not share the use of the contact hole 106 provided so as to be associated with the data line 107, respectively extend into two cell regions in association with each other.

Figure 3A:
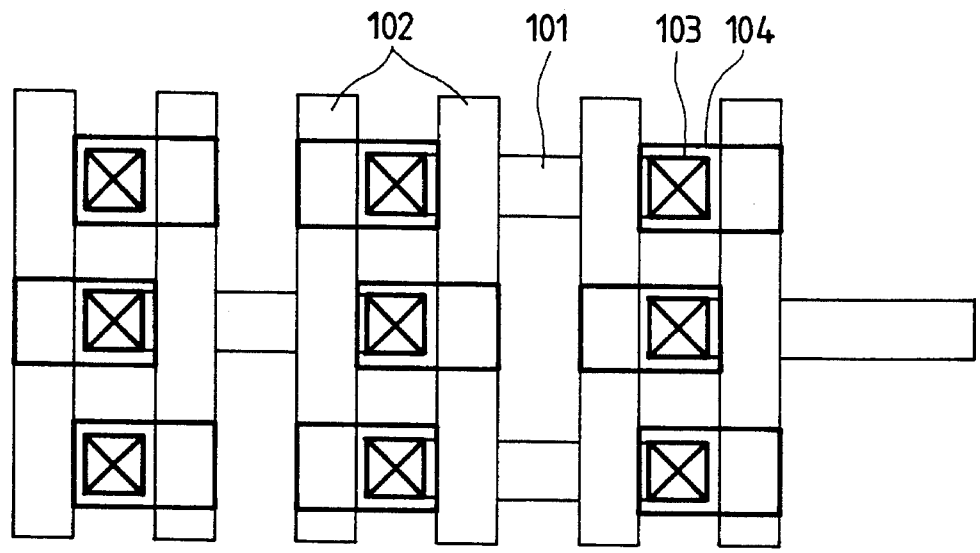
FIGS. 3a and 3b are respectively views for describing plane layouts of conventional examples.
Figure 3B:
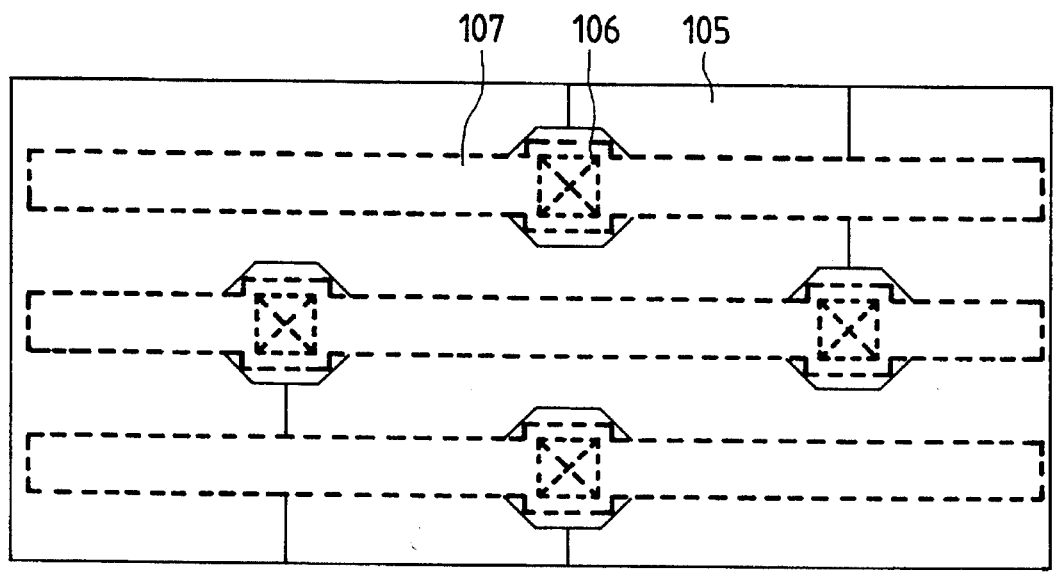

FIGS. 3a and 3b respectively show layouts of cells having conventional structures, in which capacitors 104 do not extend into regions relative to each other and are formed within a single cell region alone.

As is apparent from FIGS. 2a and 2b and FIGS. 3a and 3b, the capacitors employed in the present invention lay over the memory cells adjacent to each other because the length of the short side of each capacitor is shorter than that of a conventional capacitor but the length of the long side thereof is longer than that thereof. On the other hand, the length of the short side of the conventional capacitor is longer than that of each of the capacitors employed in the present invention, whereas the length of the long side of the conventional capacitor is shorter than that of each capacitor employed in the present invention. Therefore, the capacitors 104 does not lay over the memory cells adjacent to each other.

Therefore, the area of a plane region of each capacitor employed in the present example is about 1.25 times the area of the capacitor employed in each of the cells having the conventional structures shown in FIGS. 3a and 3b, whereas the peripheral length of each capacitor employed in the present example reaches about 11/6 times the peripheral length of each of the capacitors employed in the conventional cells. As a result, the peripheral length is greatly increasing as compared with the area of the plane region. Thus, when the capacitors employed in the present example are used in a stacked capacitor type DRAM cell in which the thickness of each of capacitor electrodes is larger than the minimum feature size (the minimum width of either a word line or a data line), the total capacitor area becomes about 2 times as compared with the conventional case even though the area of the plane region of each capacitor is about 1.25 times the area of the conventional plane region. As a result, an increase in the total capacitor area is made greater as compared with an increase in the area of the plane region of each capacitor.

Example 2

Figure 1B:
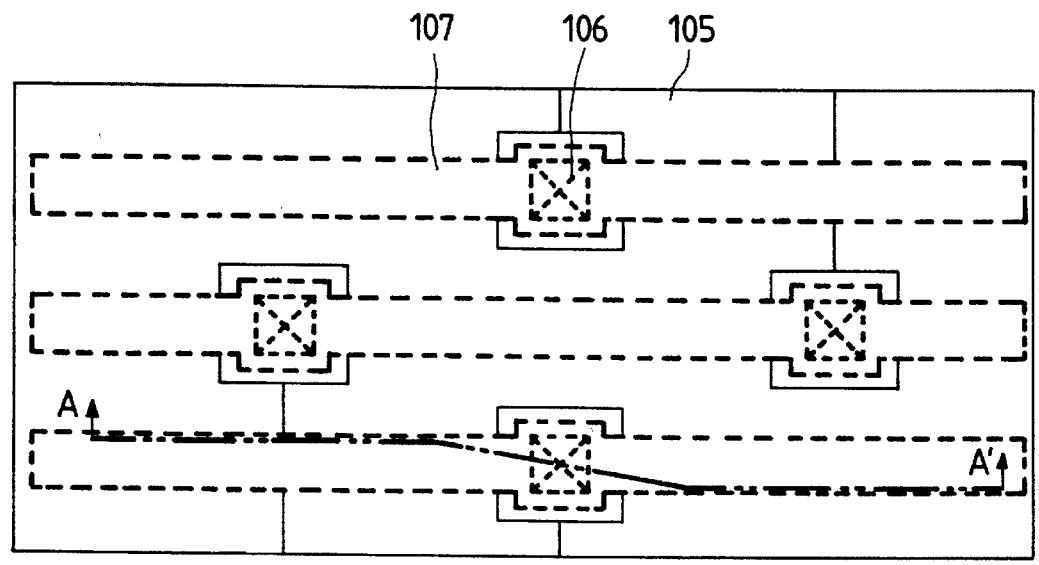
Figure 2A:
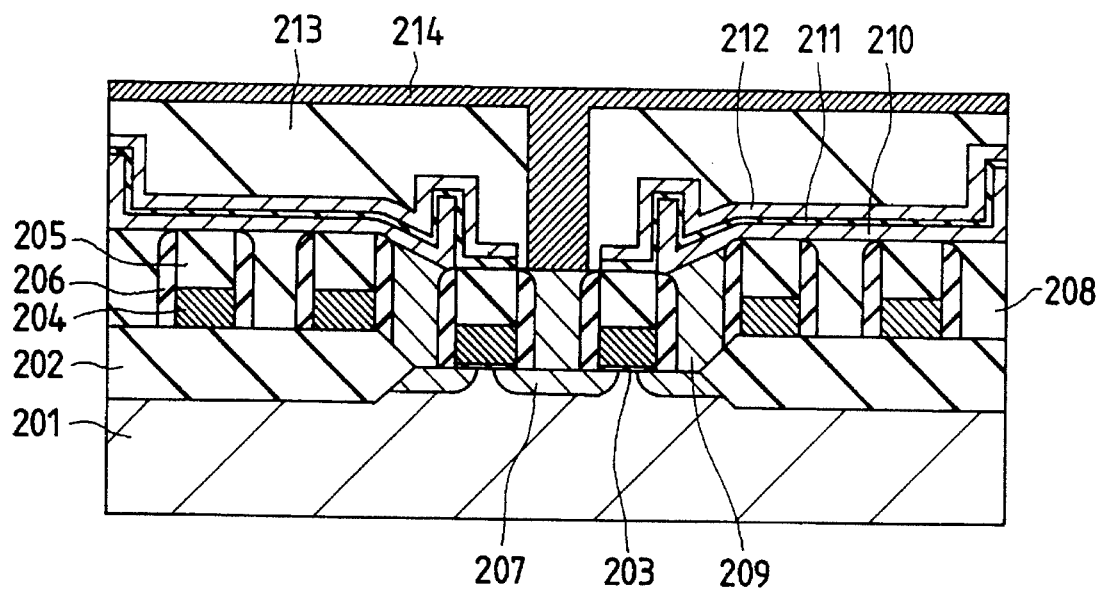
FIG. 2a is a cross-sectional view showing a second example.

The present example shows the case where the memory cells having the layouts shown in FIGS. 1a and 1b are applied to stacked capacitor type DRAM cells each having a structure in which a circumferential portion of a capacitor extends upward in wall-like form. A cross-section taken along line A—A' of FIG. 1b is shown in FIG. 2a. Each of cells shown in FIG. 2a comprises a p-type silicon substrate 201, an insulator for the isolation 202 made of a known LOCOS, an $SiO_2$ film 203 corresponding to a gate insulator, a word line 204, an $SiO_2$ film 205, a side wall 206 made of an $SiO_2$ film, an n-type impurity doped region 207, an $Si_3N_4$ film 208, a polycrystalline silicon film 209 doped with n-type impurities, a lower electrode 210 for each capacitor, which is formed of a polycrystalline silicon film, a capacitor insulator 211 made of a multi-layer film formed by stacking an $Si_3N_4$ film and an $SiO_2$ film on each other and having a thickness of 5 nm, which is equivalent to $SiO_2$, a plate 212 made of a polycrystalline silicon, an $SiO_2$ film 213, and a data line 214 made of Al.

In the DRAM cell employed in the present example as is apparent from FIG. 1a, each capacitor lays over memory cell regions adjacent to each other. Therefore, a capacitor having a long circumferential length (about 1.5 times) and a large capacity can be formed.

Example 3

Figure 2B:
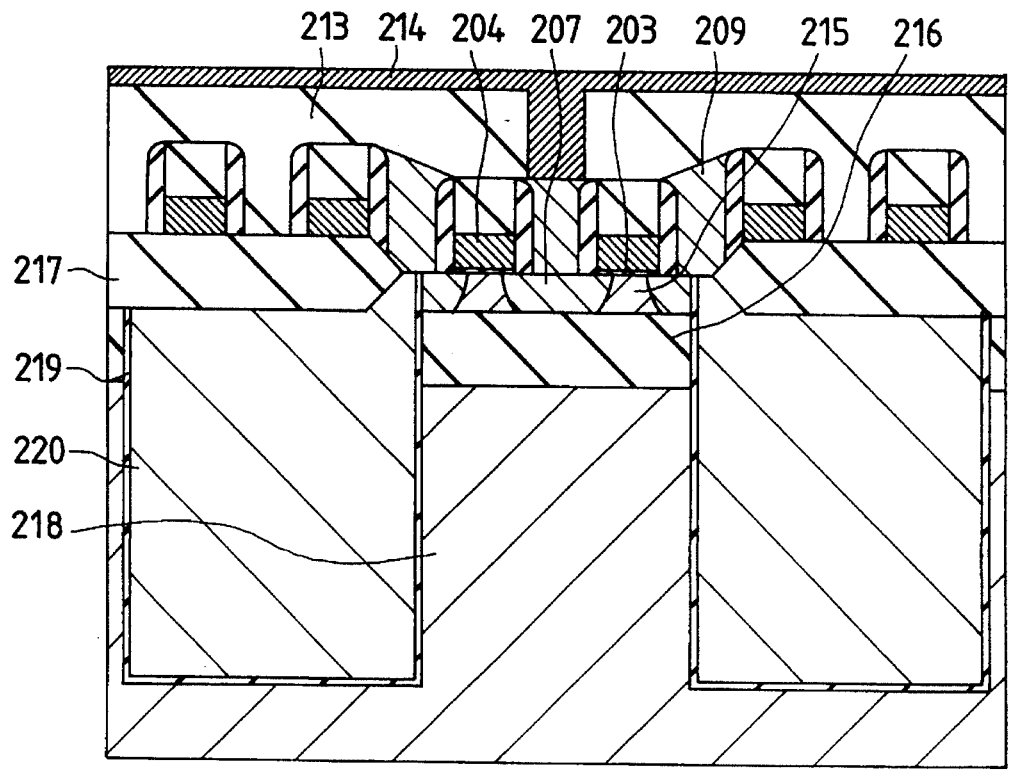
FIG. 2b is a cross-sectional view illustrating a third example.

FIG. 2b shows another example of the present invention and is a cross-sectional view of a trench type DRAM cell using trench type capacitors and SOI (Silicon On Insulator) type MOSFETs.

In order to prevent depletion of a substrate surface at a lower part of a trench, an impurity density of an n-type silicon substrate 218 is set to $1\times10^{19}/cm^3$ or more in the present example. Further, the present cell has SOI layers 215, an $SiO_2$ film 216 corresponding to a lower insulator of the SOI layers 215, $SiO_2$ films 217 for insulation and isolation, which are formed on the surface of the trench and the SOI layers 215, capacitor insulators 219 each made of a multi-layer film formed by stacking an $Si_3N_4$ film and an $SiO_2$ film on each other and having a thickness of 5 nm equivalent to $SiO_2$, and polycrystalline silicon films 220 for charge storage. The same symbols as those employed in the Example 2 indicate those identical to those employed in the Example 2.

Since a capacitor region employed in the present example lays over the memory cell regions adjacent to each other in a manner similar to the Example 2, a trench capacitor having a long circumferential length and a capacity greater than that of a normal trench capacitor can be obtained.

Example 4

Figure 4A:
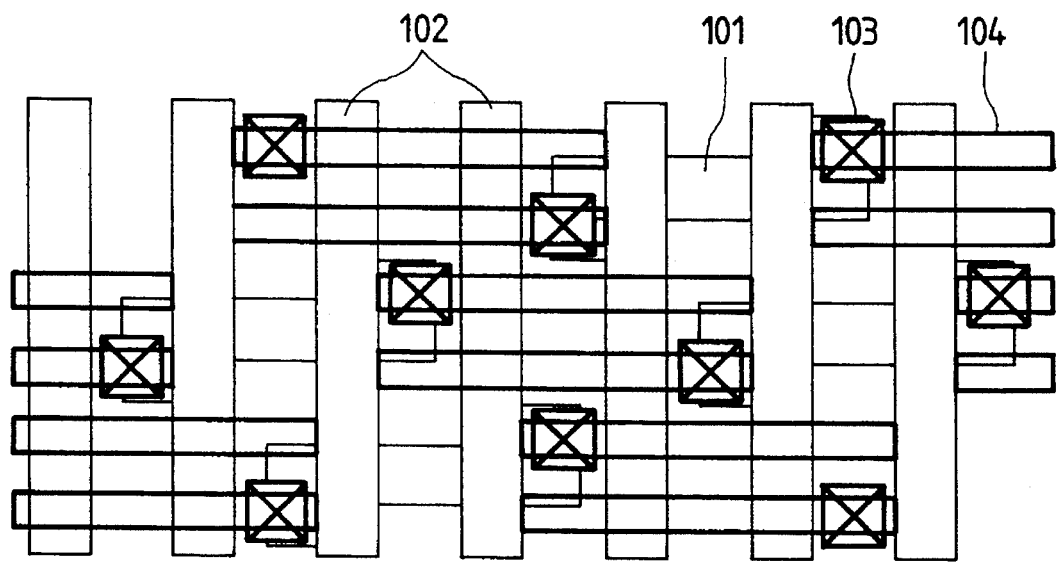
FIGS. 4a and 4b are respectively views for describing a plane layout of a fourth example.
Figure 4B:
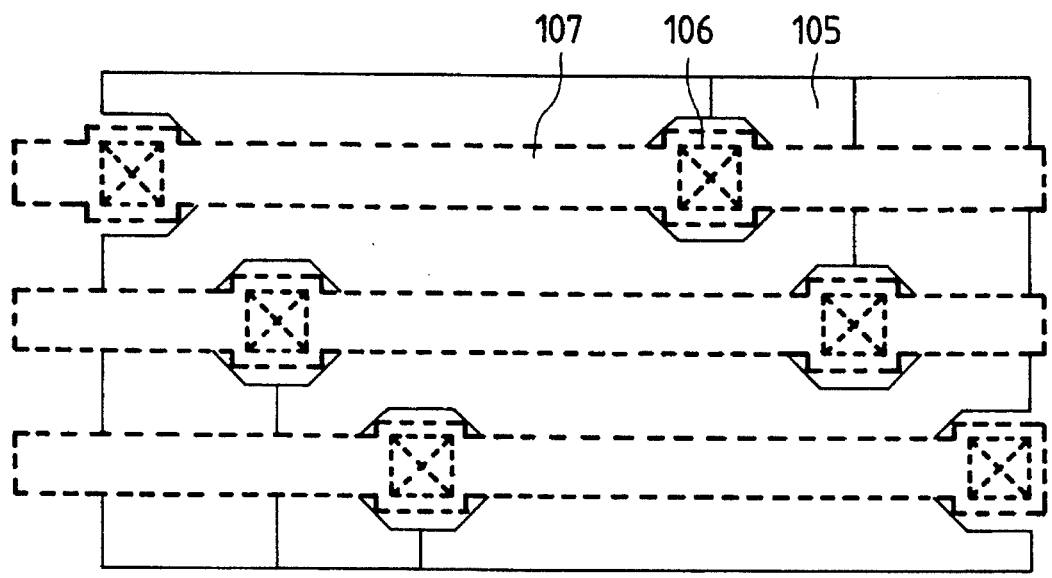

FIGS. 4a and 4b respectively shows further examples of the present invention using ¼ pitch layouts.

In the present example as is apparent from FIG. 4a, other active regions are not placed neighbor active regions 101 along the directions in which data lines 107 extend from lower parts of left ends of the active regions 101 and upper parts of right ends thereof respectively. Therefore, the respective active regions 101 can respectively extend in the directions in which the data lines 107 extend from the lower parts of the left ends of the active regions 101 and the upper parts of the right ends thereof. Since a region at which the active region 101 and the capacitor 104 overlap each other, can be increased as compared with the Example 1, a problem caused by misalignment is less reduced. Incidentally, FIG. 4b shows the layout of data lines 107, a plate 105 and contact holes 106.

Example 5

Figure 5A:
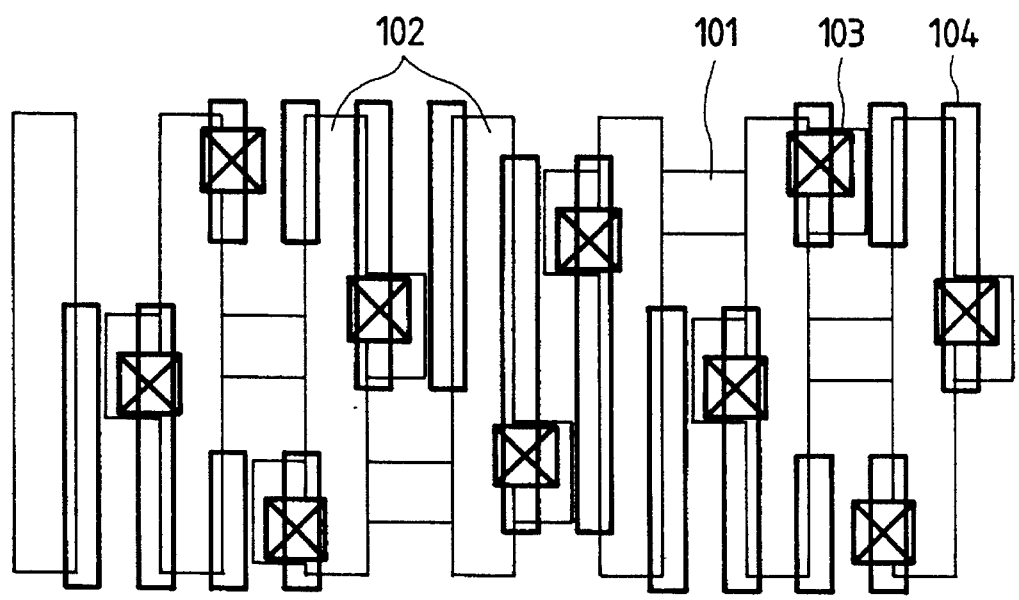
FIGS. 5a and 5b are respectively views for describing a plane layout of a fifth example.
Figure 5B:
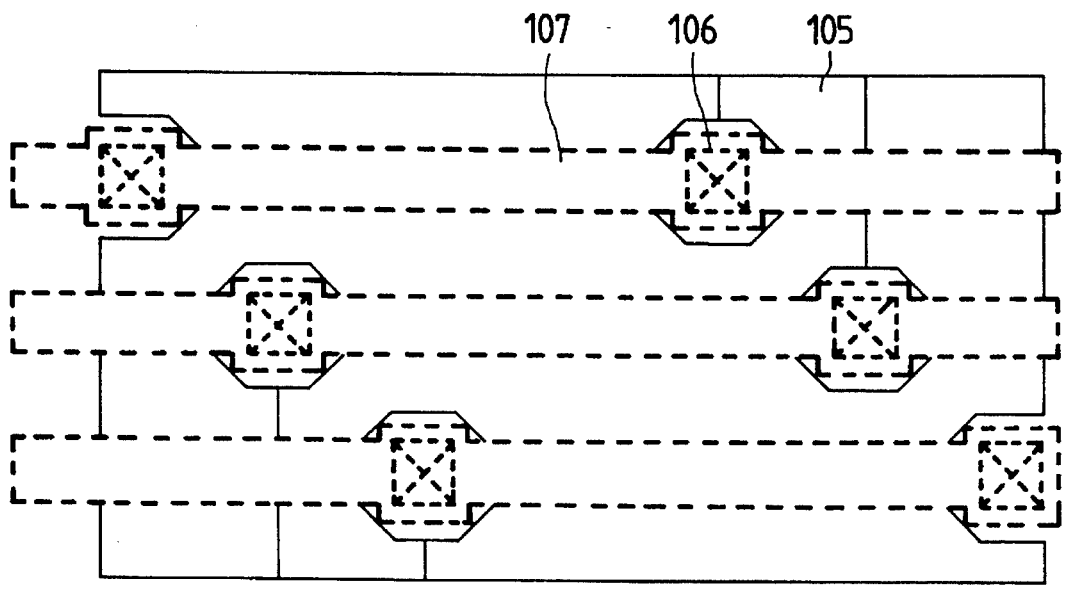

FIGS. 5a and 5b respectively illustrate examples in which the layouts of the capacitors 104 employed in the Example 4 have been changed. In the Example 4, each of the capacitors 104 is disposed in the same direction as the direction in which the data line 107 extends. In the present example, however, the capacitors 104 extend in the same direction in which word lines 102 extend, and are provided so as to meet at right angles to data lines 107.

Even in the case of the present example, an effective area of each capacitor is greatly increased in a manner similar to the Example 1 as compared with each of the capacitors having the conventional structures. Particularly, when the average pitch of the data line 107 of each memory cell is larger than that of the word line 102, the length of the long side of the capacitor 104 employed in the present example can be made greater than that of the capacitor 104 employed in the Example 1. Therefore, an effect for increasing the area of each capacitor can further be enhanced.

Example 6

Figure 6:
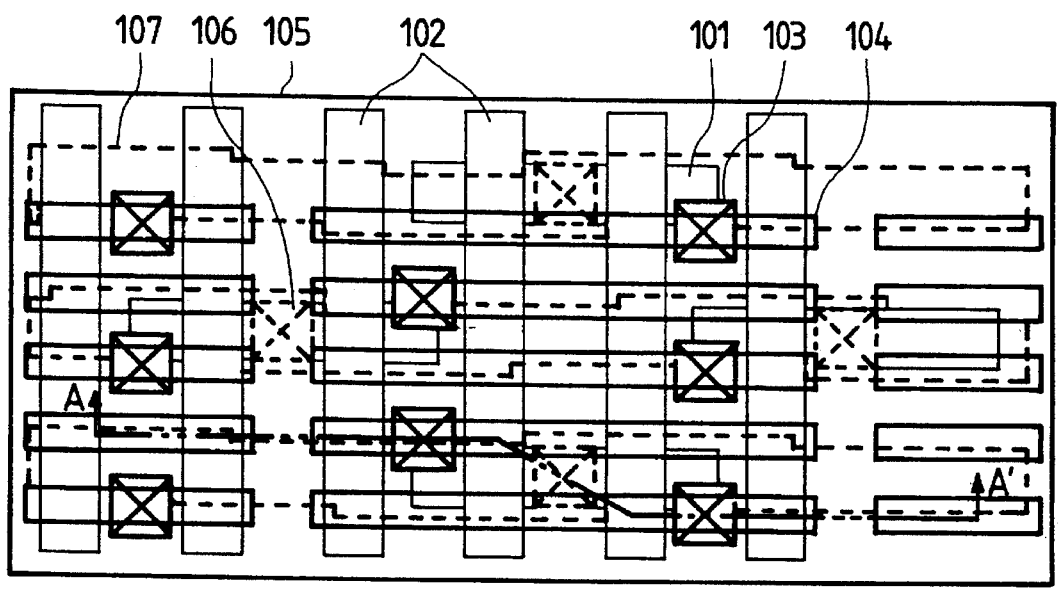
FIG. 6 is a view for describing a plane layout of a sixth example.

FIG. 6 shows the layout of the Example 6 of the present invention. Since each of capacitors 104 lays over a data line 107 in a folded data line (two-intersection) system in the present example, a capacitor having a larger surface area is formed. Thus, the capacitor, which is large in capacity and high in reliability, is obtained.

Example 7

The present example illustrates an example in which the capacitors each shaped in the form of a three-dimensional structure having the plane layout shown in the example 6, are formed on a semiconductor substrate. A structure having a cross section taken along line A—A' of FIG. 6 is shown in FIG. 7.

Figure 7:
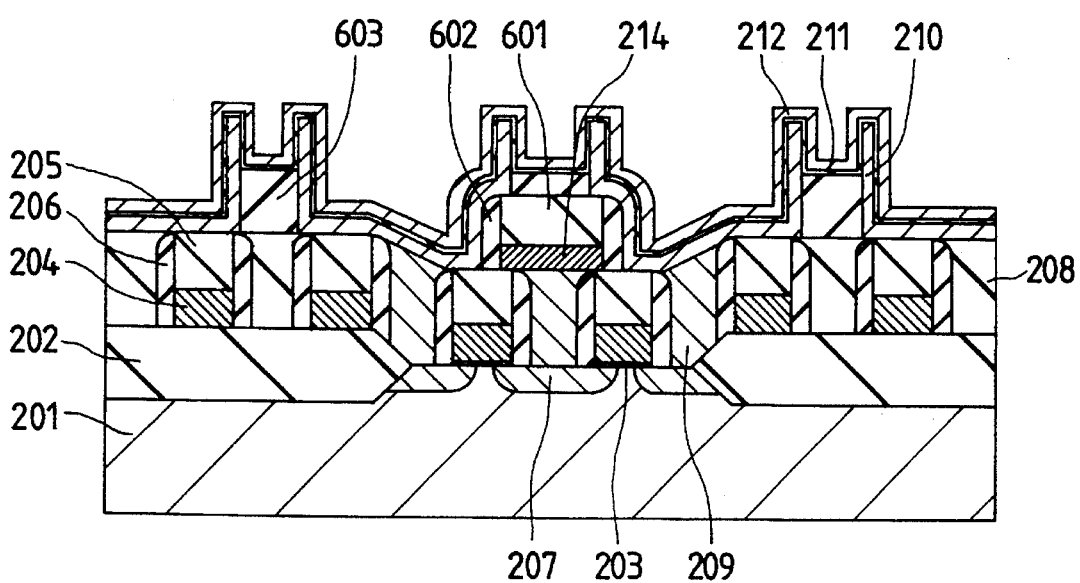
FIG. 7 is a cross-sectional view showing a seventh example.

In the present example as is apparent from FIG. 7, each of capacitors, which is comprised of a lower electrode 210, a capacitor insulator 211 and a plate 212, lays over a data line 214. Since the present example has such a three-dimensional structure, an effect for increasing the area of each capacitor becomes more pronounced. In the case of the present example as compared with the Example 1, a plane area and its circumferential length can be increased to about 7/5 times the plane area of the capacitor employed in the Example 1 and about 15/11 times the circumferential length thereof respectively. Incidentally, reference numerals 601, 602 and 603 shown in FIG. 7 respectively indicate an $SiO_2$ film, a side wall and an $Si_3N_4$ film.

Example 8

Figure 8:
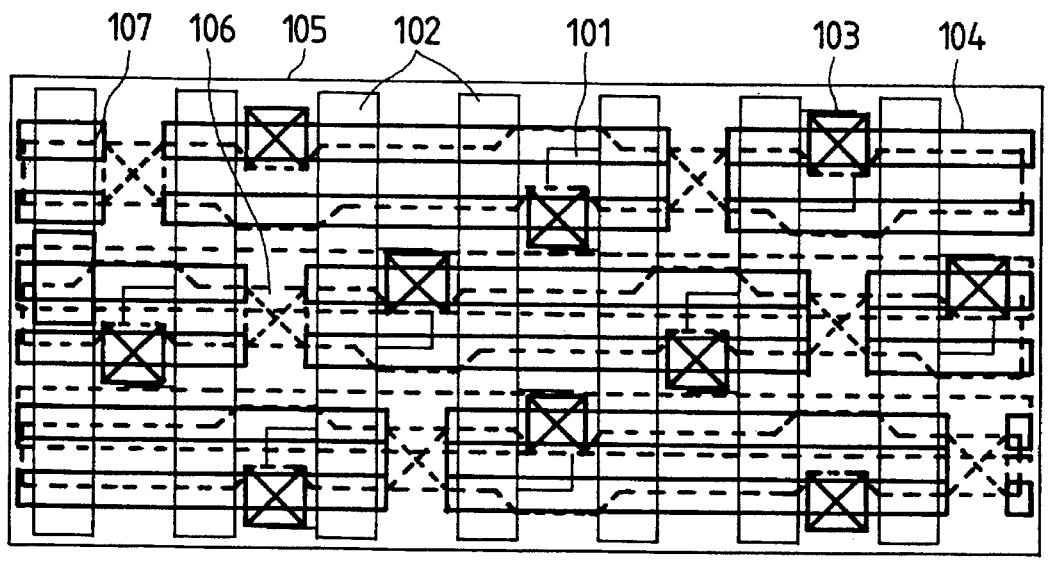
FIG. 8 is a view for describing a plane layout of an eighth example.

FIG. 8 shows an example in which a part of the Example 6 is changed and ¼ pitch layouts are used. In the present example as is apparent from FIG. 8, each of active regions 101 can extend in both directions because other active region is not placed in the vicinity of a lower part of a left end of the active region 101 and an upper part of a right end thereof. Therefore, a region at which each of the active regions 101 and its corresponding capacitor 104 overlap each other, can be made greater. Thus, a problem caused by misalignment is less reduced.

Example 9

Figure 9:
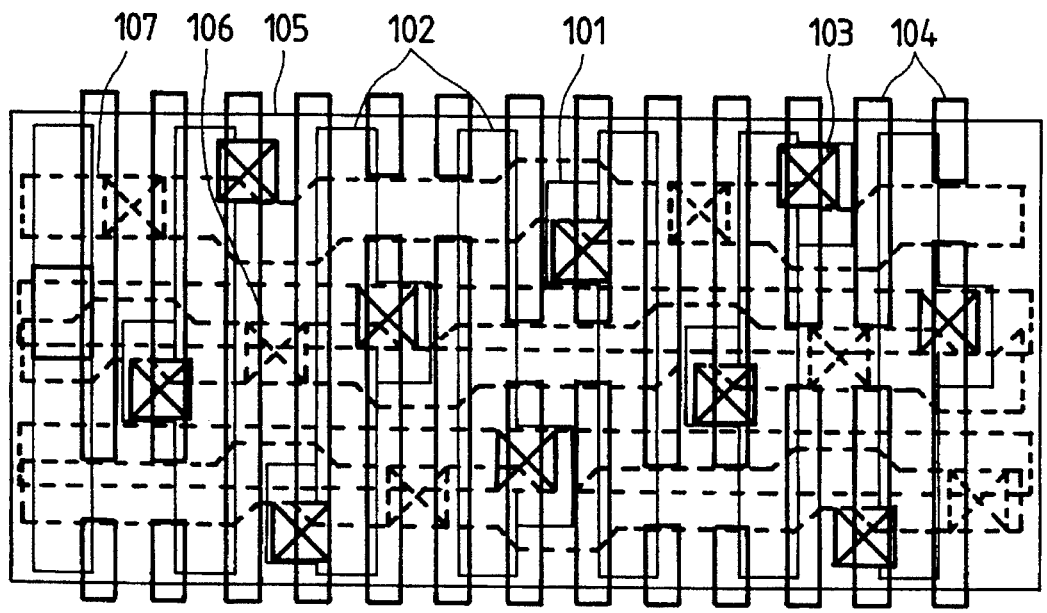
FIG. 9 is a view for describing a plane layout of a ninth example.

FIG. 9 shows an example in which the layout of each of the capacitors 104 employed in the Example 8 is changed. The direction of the long side of each capacitor 103 meets at right angles to each of word lines 102 in the Example 8, whereas the direction of the long side of the capacitor 104 extends in the same direction as that of the word line 102 as shown in FIG. 9 in the present example. Therefore, the dimension of the long side of the capacitor 104 can be made longer than that of the long side of the capacitor 104 employed in the Example 8 by making the average pitch of the data line 107 greater than the average pitch of the word line 102. Thus, an effect for increasing the area of the capacitor 104 can be further enhanced.

Example 10

Figure 10A:
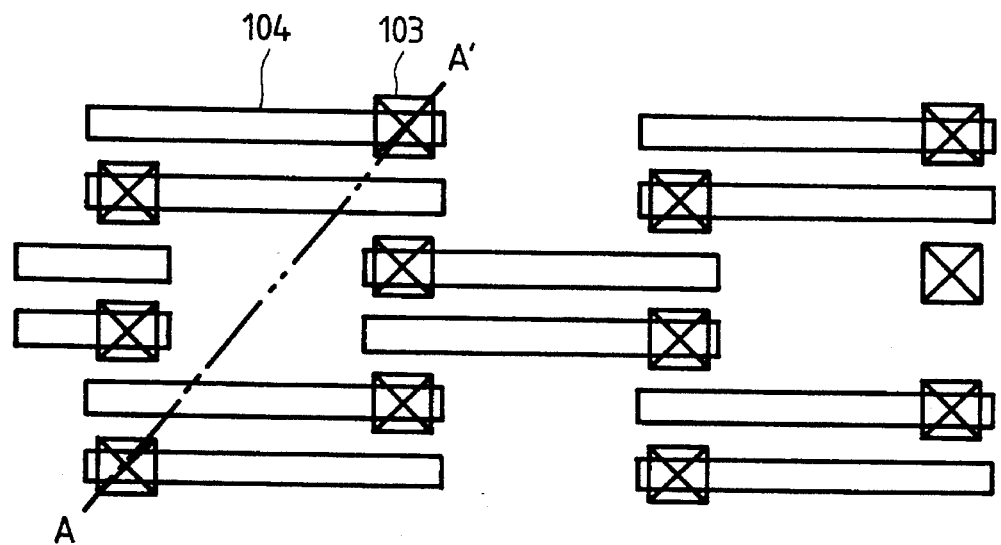
FIG. 10a is a view for describing a plane layout of a tenth example.

FIG. 10a shows an example of a system in which contact holes 103 and capacitors 104 employed in the present invention are laid out.

FIG. 10a shows the case where the pitch of each data line is relatively large and illustrates an example in which two capacitors 104 are disposed with respect to a single data line. Patterns other than the capacitors 104 are formed by the normal photo-lithography. However, since the two capacitors 104 are provided so as to correspond to the single data line, only the pattern of each capacitor 104 is brought into an extremely fine state. Therefore, the normal photo-lithography makes it difficult to form the patterns. To overcome this difficulty, the patterns are formed by lithography extremely high in resolution, such as a phase shift method or annular illumination or the like or by electron bean lithography.

Example 11

Figure 10B:
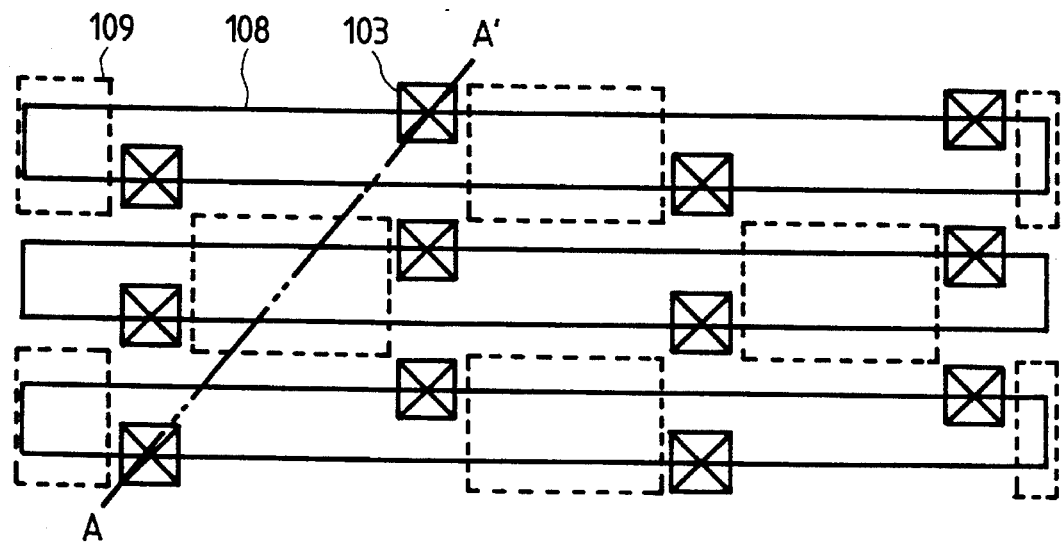
FIG. 10b is a view for describing a plane layout of an eleventh example.

FIG. 10b shows a plane pattern (mask pattern) capable of realizing a structure equivalent to that shown in FIG. 10a where each of the capacitors 104 is fine and the layout shown in FIG. 10a cannot be formed by the aforementioned lithography.

Each of the capacitors 108 is formed as a continuous pattern along the data line. Each of capacitor cutting portions 109 shows a pattern for cutting the capacitor 108 to a predetermined length and defining each of etching regions.

FIGS. 10a and 10b respectively show the layouts in which the longitudinal directions of the capacitors are arranged so as to be aligned with the data line directions. It is however needless to say that the longitudinal directions of the capacitors may be arranged in alignment with the directions in which word lines extends.

Example 12

The present example shows an example for describing a process of forming capacitors after the formation of the word lines 204, the $SiO_2$ films 205 and the side wall insulators 206 and the like when a semiconductor memory device having the structure shown in FIG. 2a is formed. To simplify the description of the present example and provide an easy understanding thereof, the illustration and description of portions, which have no direct bearing on the formation of the capacitors, will be omitted in the present example. Only a method of forming capacitor electrodes is shown in the present example.

FIGS. 11a through 11f are respectively process diagrams for describing a method of forming capacitor electrodes at a cross section taken along line A—A' of FIG. 10a.

Figure 11A:
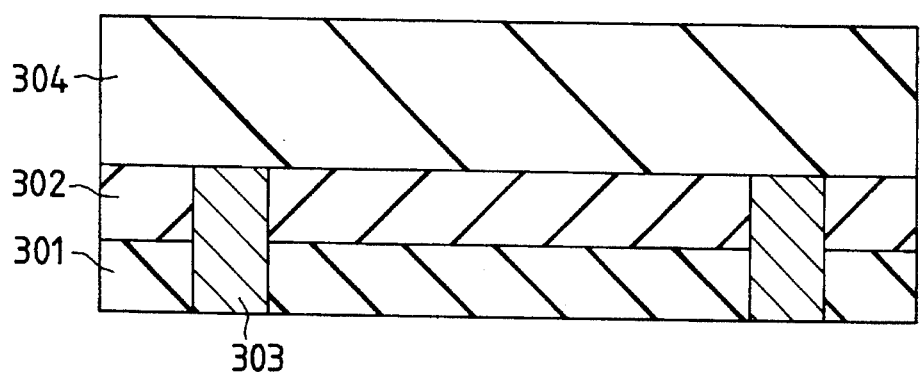
FIGS. 11a through 11f are respectively process views for describing a twelfth example.

As shown in FIG. 11a, an $SiO_2$ film 301 and an $Si_3N_4$ film 302 are first formed in a stack. Thereafter, predetermined portions of the $Si_3N_4$ film 302 and the $SiO_2$ film 301 are etched using resist patterns (not shown) for forming the contact holes 103 shown in FIG. 10a. After the formation of openings, polycrystalline silicons 303 doped with n-type impurities are filled into their corresponding openings. Further, an $SiO_2$ film 304 is formed over the whole surface of the substrate.

Figure 11B:
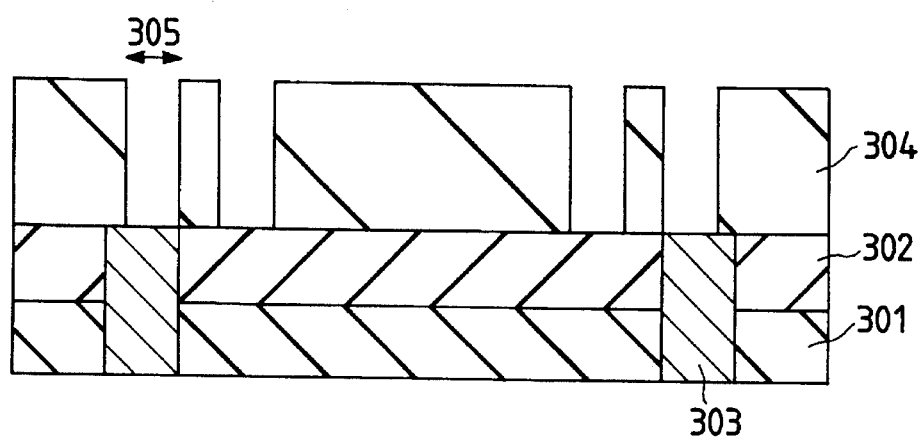

Next, resist patterns for forming the capacitors 104 shown in FIG. 10a are used as masks so as to etch an exposed portion of the $SiO_2$ film 304, thereby forming capacitor regions 305 as shown in FIG. 11b.

Figure 11C:
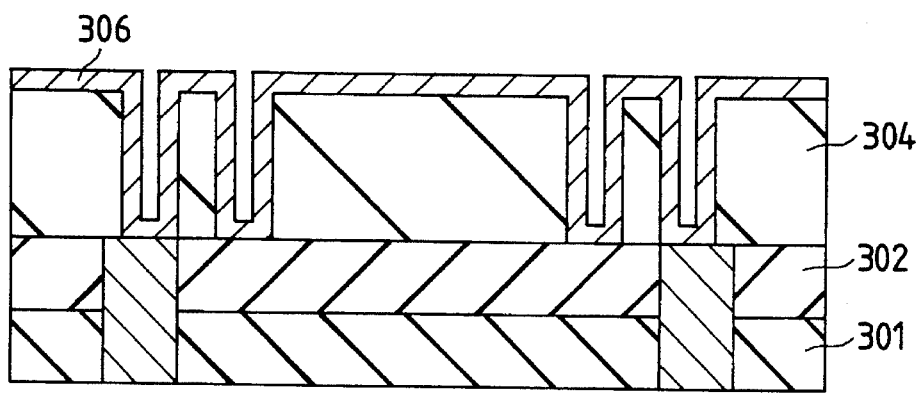

As shown in FIG. 11c, a polycrystalline silicon film 306 doped with n-type impurities is formed over the whole surface of the substrate by the known Chemical Vapor Deposition (CVD).

Figure 11D:
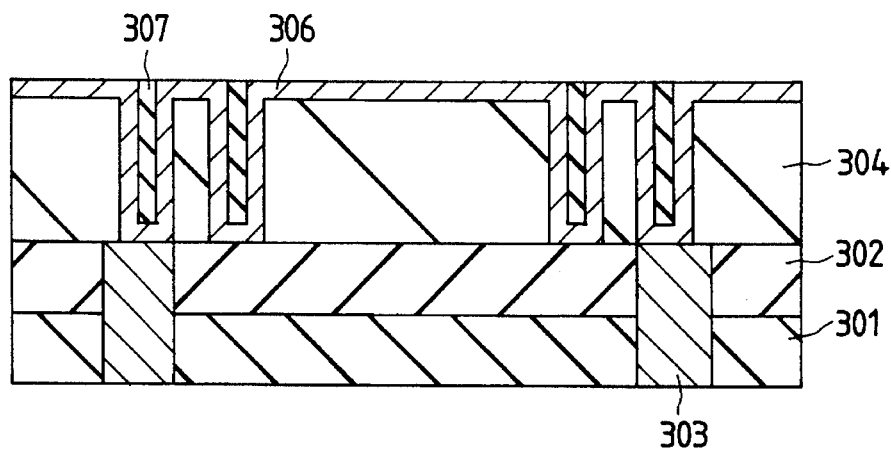

After an $SiO_2$ film 307 has been formed over the whole surface of the polycrystalline silicon film 306 by the Chemical Vapor Deposition, a known etchback process is next effected on the resultant product. Further, only the portions of the $SiO_2$ film 307, which have been formed within the capacitor regions 305, are left as they are as shown in FIG. 11d and the remaining portions of the $SiO_2$ film 307, which have been formed on other portions, are removed.

Figure 11E:
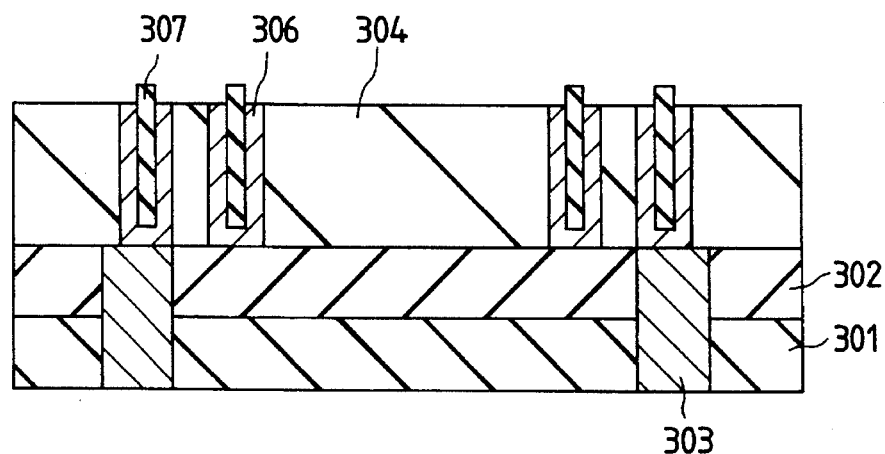
Figure 11F:
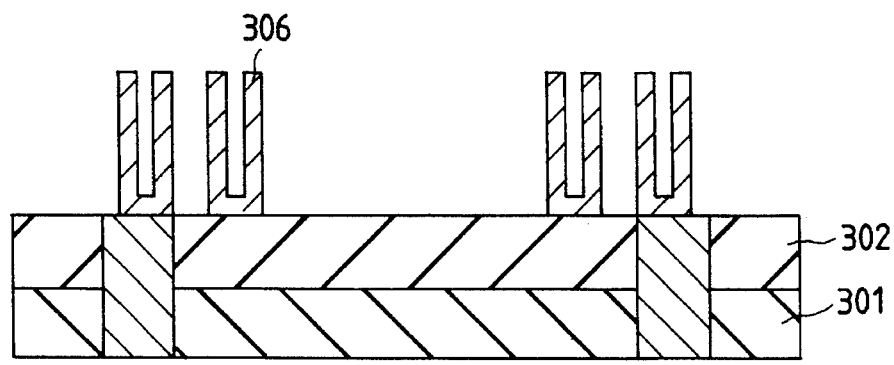

After the polycrystalline silicon film 306 formed on the upper surface of the $SiO_2$ film 304 has been etched and removed as shown in FIG. 11e, the $SiO_2$ film 304 and the $SiO_2$ film 307 are etched with a solution composed principally of HF and removed. Then, capacitor electrodes each comprised of the polycrystalline silicon film are formed as shown in FIG. 11f.

Capacitor insulators and upper electrodes or the like are hereafter formed by the known method. The semiconductor memory device having the structure shown in FIG. 2a is formed in this way.

Example 13

The present example shows, as an example, a method of forming capacitor electrodes for the capacitors 108 as seen from a cross-section taken along line A—A' of FIG. 10b.

Figure 12A:
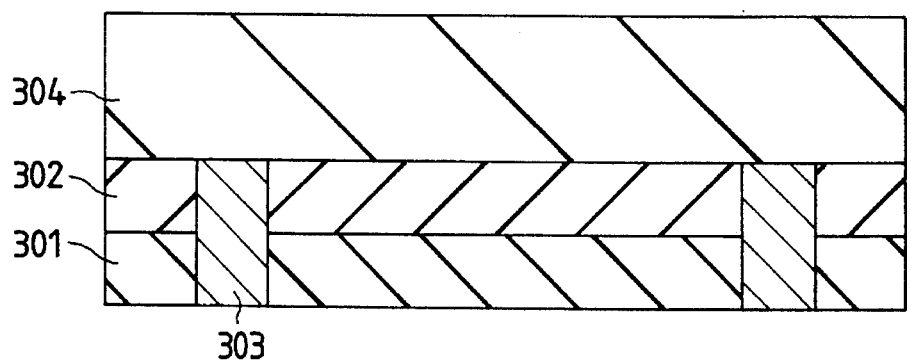
FIGS. 12a through 12j are respectively process views for describing a thirteenth example.

FIG. 12a corresponds to FIG. 11a illustrative of the Example 11 and shows the manner in which each of openings is filled with a polycrystalline silicon 303 doped with n-type impurities.

Figure 12B:
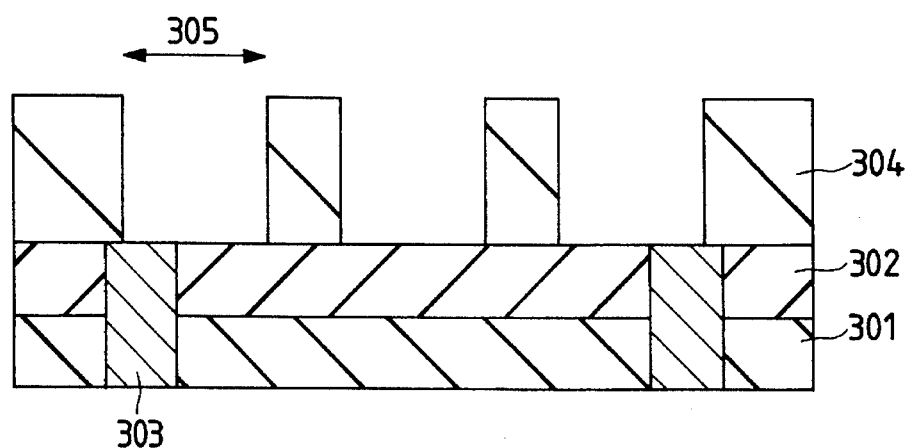

As shown in FIG. 12b, predetermined portions of the $SiO_2$ film 304 are etched by the known unisotropic etching using the resist patterns (not shown) for forming the capacitors 108 shown in FIG. 10b as etching masks so as to form capacitor regions 305.

Figure 12C:
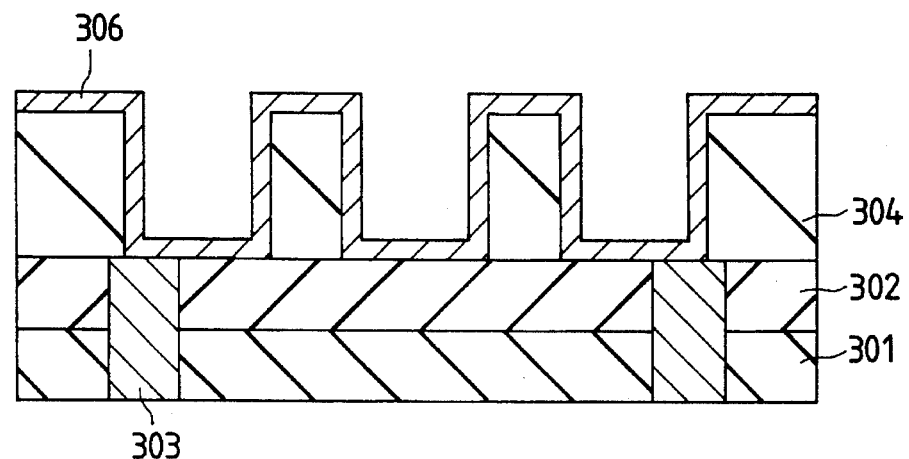
Figure 12D:
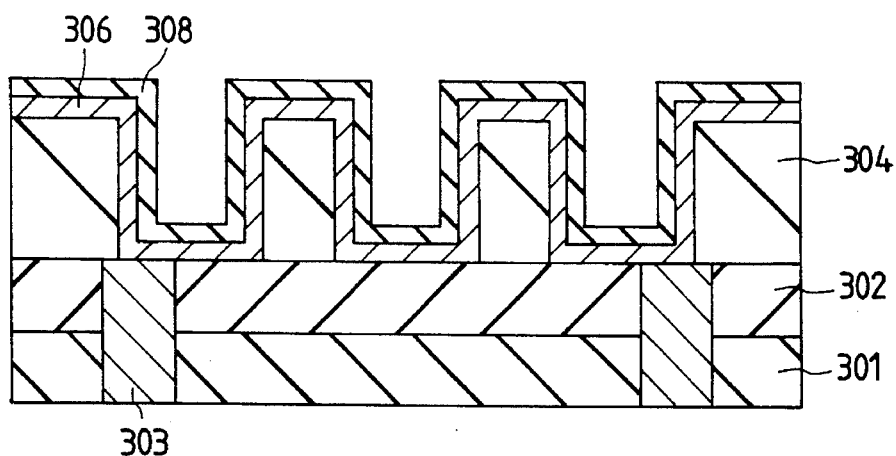
Figure 12E:
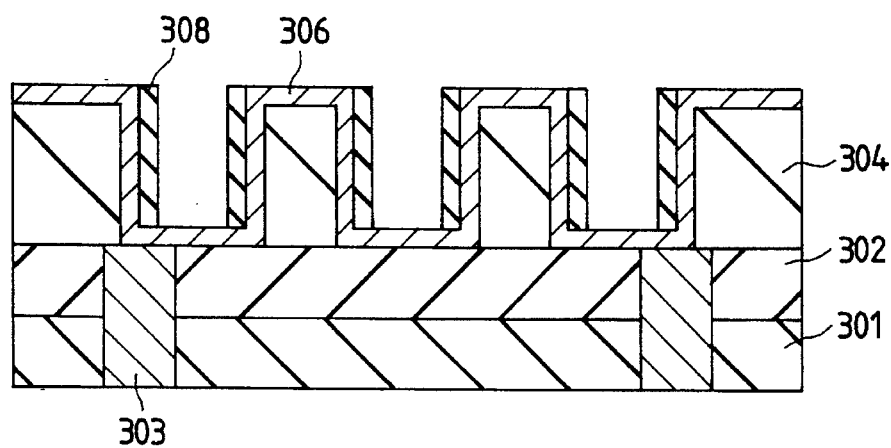

Next, a polycrystalline silicon film 306 doped with n-type impurities is formed over the whole surface as shown in FIG. 12c by the known CVD. Thereafter, an $SiO_2$ film 308 is formed over the whole surface as shown in FIG. 12d. Further, the unisotropic etching is effected on the resultant product to remove portions of the $SiO_2$ film 308, which are formed on planar regions and leave only portions formed on wall regions of the capacitor regions 305, thereby forming side walls 308 made of $SiO_2$.

Figure 12F:
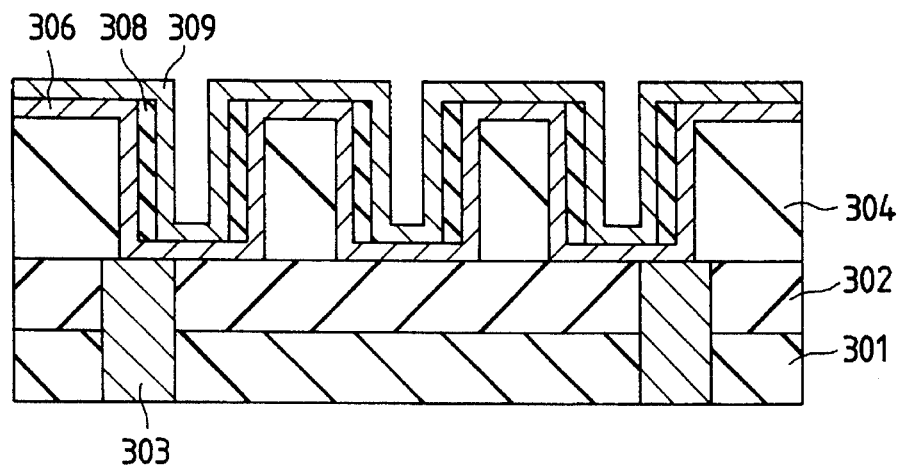
Figure 12G:
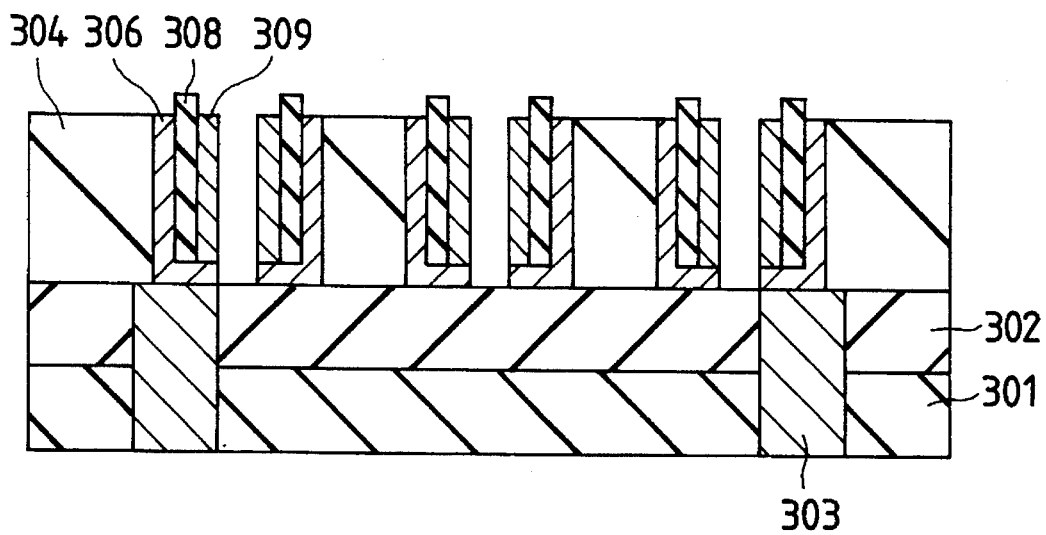

A polycrystalline silicon film 309 is formed over the whole surface as shown in FIG. 12f. Thereafter, the unisotropic etching is effected on the whole surface so as to leave portions of the above polycrystalline silicon film 309 and polycrystalline silicon film 306, which have been formed on side surfaces and lower parts of the side walls 308 and remove other portions. At this time, the polycrystalline silicon film 306 formed on the bottoms of the openings is completely removed. Further, the polycrystalline silicon films 306 and 309 left on both walls of the openings are completely separated from each other.

Figure 12H:
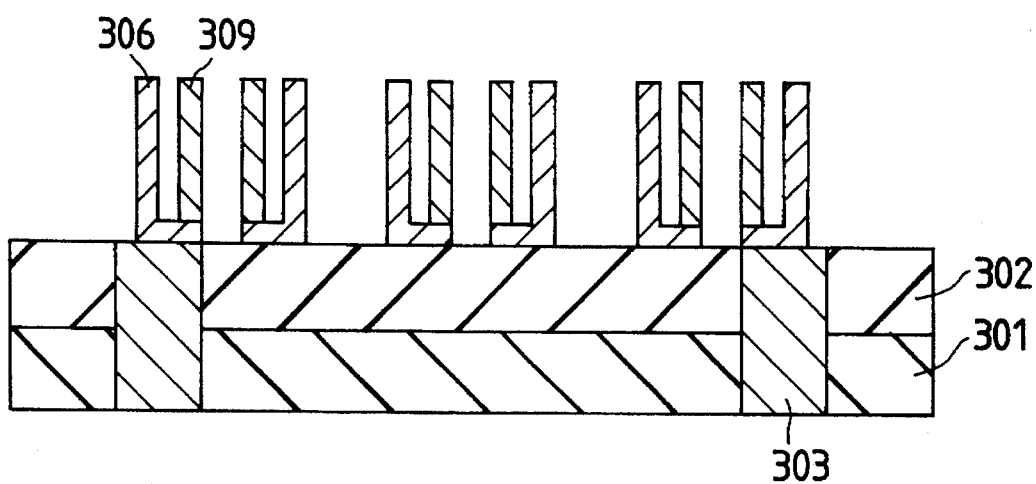

Next, etching using a solution composed principally of HF is effected on the resultant product to thereby remove the $SiO_2$ films 304 and 308 as shown in FIG. 12h.

Figure 12I:
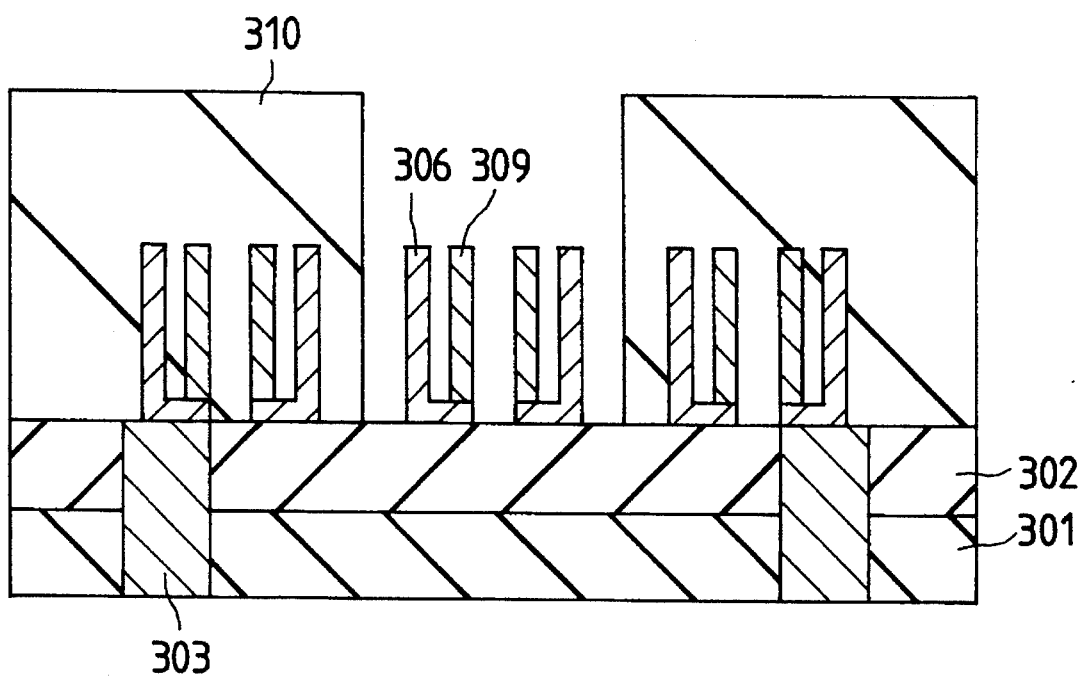
Figure 12J:
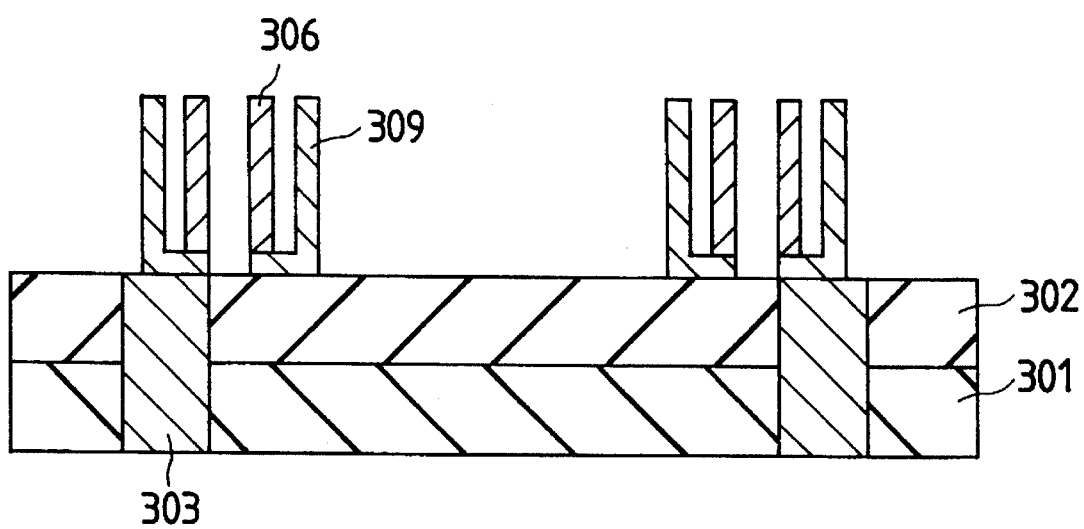

Resist films 310 corresponding to the patterns 109 for the capacitor cutting portions shown in FIG. 10b are used as masks. In this condition, the exposed polycrystalline silicon films 306 and 309 are etched as shown in FIG. 12i so as to form lower electrodes for the capacitors made of the polycrystalline silicon films 306 and 309 as shown in FIG. 12j.

The capacitor insulators and the upper electrodes or the like are hereafter formed by the normal method so as to form a semiconductor memory device.

Example 14

FIGS. 13a through 13i are respectively process views for describing a method of forming a semiconductor memory device having the structure shown in FIG. 2a.

Figure 13A:
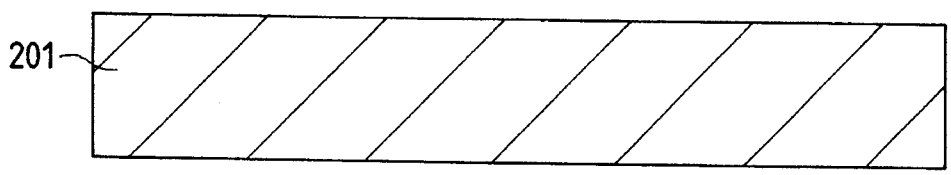
FIGS. 13a through 13i are respectively process views for describing a fourteenth example.
Figure 13B:
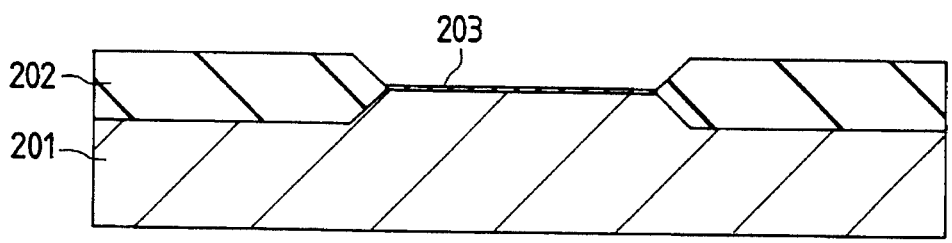

A region for the isolation 202 having a thickness of 200 nm is first formed on the surface of a p-type silicon substrate 201 shown in FIG. 13a by the known LOCOS method as shown in FIG. 13b. Thereafter, an $SiO_2$ film 203 for a gate oxide film having a thickness of 6 nm is formed on the surface of an active region by the known oxidation method.

Figure 13C:
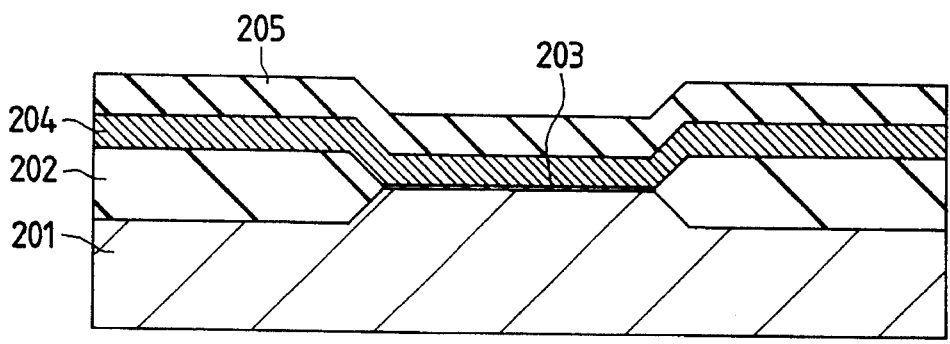

A word line 204 made of a polycrystalline silicon film having a thickness of 100 nm is formed by the known Chemical Vapor Deposition as shown in FIG. 13c. Further, an $SiO_2$ film 205 having a thickness of 130 nm is formed on the word line 204 by the Chemical Vapor Deposition.

Figure 13D:
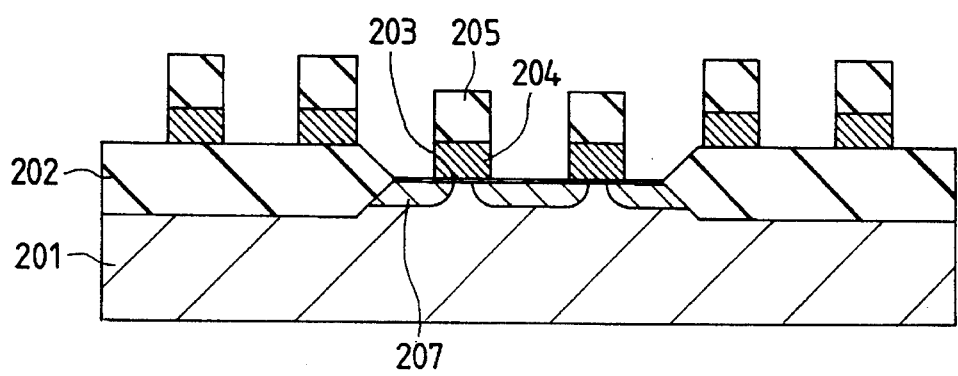

Exposed portions of the $SiO_2$ film 205 and the word line 204 are etched using resist patterns (not shown). Thereafter, an n-type impurity phosphorous having a dose of $3 \times 10^{13}/cm^2$ is implanted into the surface of the active region under an accelerated energy of 20 keV by the known ion implantation to thereby form n-type impurity doped layers 207 as shown in FIG. 13d.

Next, an $SiO_2$ film having a thickness of 50 nm is formed by the Chemical Vapor Deposition. Thereafter, the whole-surface unisotropic etching is effected on the resultant product so as to leave the $SiO_2$ film on each of walls of the word line 204 and the $SiO_2$ film 205 alone and remove it from above other portions, thereby forming side walls 206. An $Si_3N_4$ film 208 having a thickness of 200 nm is next formed over the whole surface by the Chemical Vapor Deposition. Thereafter, the known etchback is effected on the resultant product so as to fill each of spaces defined between respective adjacent word lines 204 with the $Si_3N_4$ film 208 and remove the $Si_3N_4$ film 208 from above other portions, thereby making the entire surface flat as shown in FIG. 13e.

The $Si_3N_4$ film 208 formed on each of regions for forming contacts for data lines and that formed on each of regions for forming contacts for capacitors, are etched and removed by using resist patterns (not shown). Thereafter, a polycrystalline silicon film 209 doped with an n-type impurity having a thickness of 200 nm is formed over the whole surface by the Chemical Vapor Deposition, after which the known etchback is effected on the resultant product so as to fill each of contact holes with the polycrystalline silicon film 209 and remove it from above other regions as shown in FIG. 13f.

Figure 13E:
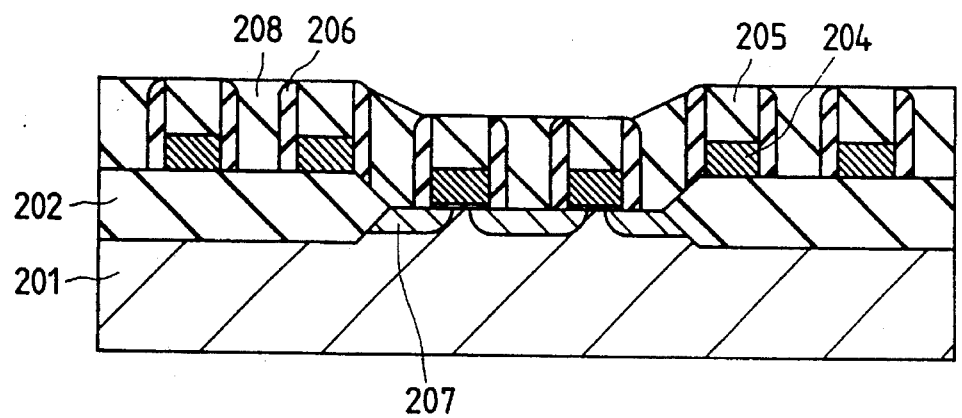
Figure 13F:
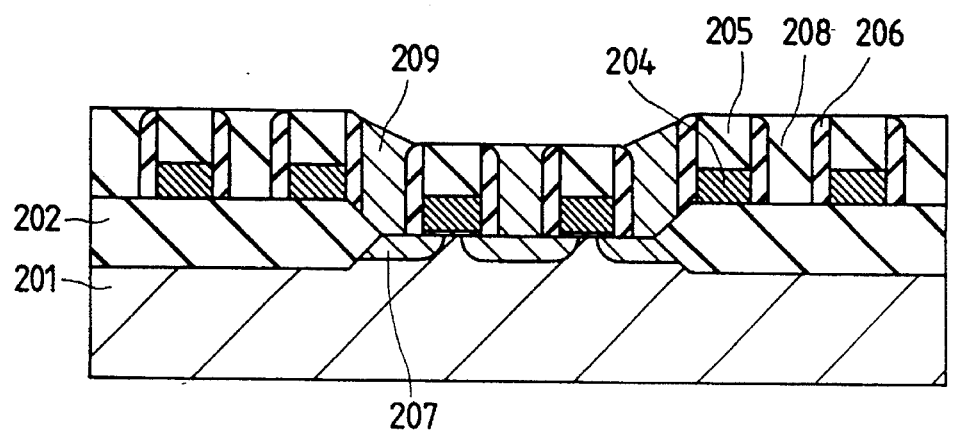

Incidentally, the $Si_3N_4$ film 208 may be etchbacked after the contact holes have been defined before the etchback of the $Si_3N_4$ film 208 and each of the contact holes has been filled with the polycrystalline silicon film 209 in FIGS. 13e and 13f.

Figure 13G:
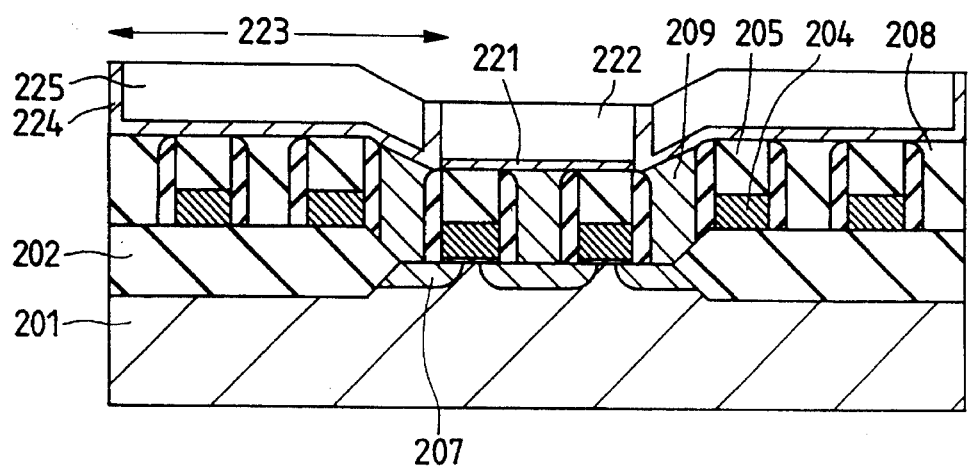

Next, an $Si_3N_4$ film 221 having a thickness of 50 nm and an $SiO_2$ film 222 having a thickness of 250 nm are formed by the known Chemical Vapor Deposition. Thereafter, the $SiO_2$ film 222 and the $Si_3N_4$ film 221 formed within a capacitor region 223 are etched and removed by using resist patterns (not shown), after which a polycrystalline silicon film 224 including an n-type impurity having a thickness of 30 nm is formed on the resultant product. Further, each of concave portions is filled with an $SiO_2$ film 225 by the Chemical Vapor Deposition and the known method using the etchback. Furthermore, the polycrystalline silicon film 224 exposed to the surface of the substrate is etched and removed as shown in FIG. 13g.

Figure 13H:
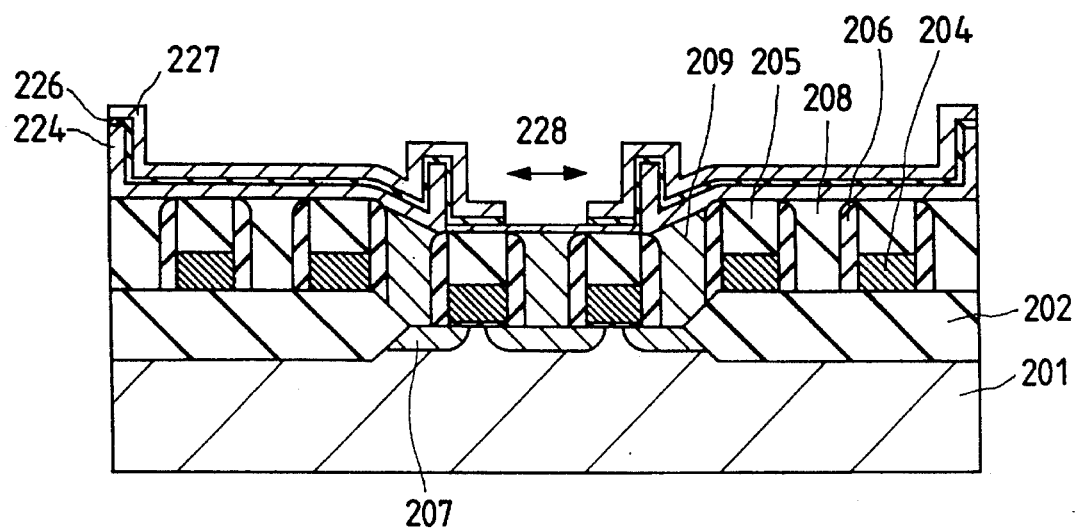
Figure 13I:
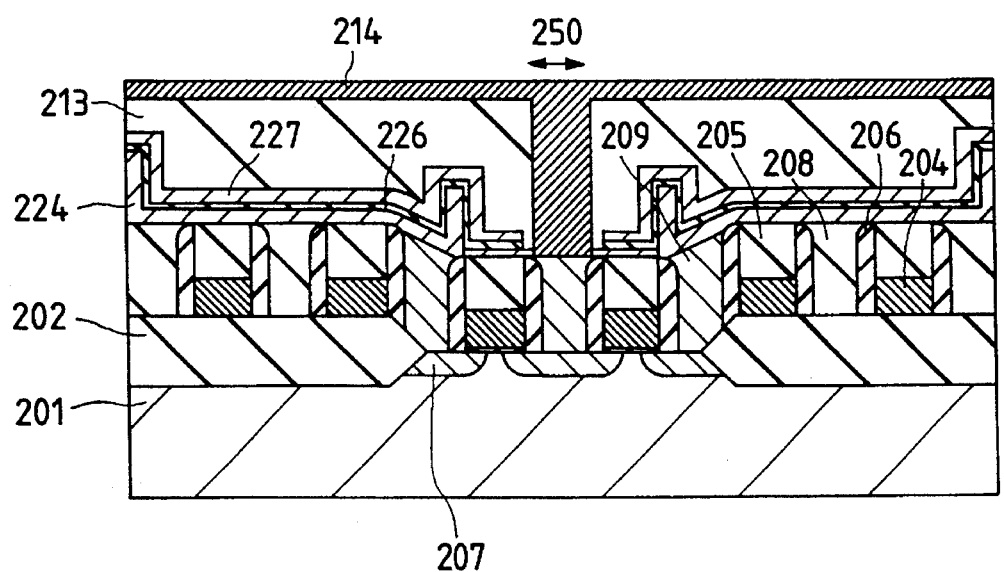

The $SiO_2$ film 225 and the $SiO_2$ film 222 are etched with a solution composed principally of HF and removed. Thereafter, a capacitor insulator 226 having a thickness of 5 nm equivalent to $SiO_2$ is formed which is comprised of a multi-layer film formed by stacking an $Si_3N_4$ film and an $SiO_2$ film on each other. Next, a plate 227 composed of a polycrystalline silicon film doped with n-type impurities is formed by the Chemical Vapor Deposition. Thereafter, exposed portions of the plate 227 are etched using resist patterns (not shown) to thereby define an opening 228 in a contact region extending from the corresponding data line as shown in FIG. 13h.

After an $SiO_2$ film 213 has been formed by the known Chemical Vapor Deposition, resist patterns (not shown) are used as masks. In this condition, the $SiO_2$ film 213 formed in a contact region 250 for providing electrical connections between the data line and a memory cell is etched and removed. The data line 214 made of a tungsten film having a thickness of 100 nm in total is formed by the known sputtering and Chemical Vapor Deposition so as to fabricate a semiconductor memory device having a structure shown in FIG. 13i.

Example 15

FIGS. 14a through 14e show a method of forming an embodiment in which a part of the Example 14 is changed and each of capacitors is laid over a data line.

Figure 14A:
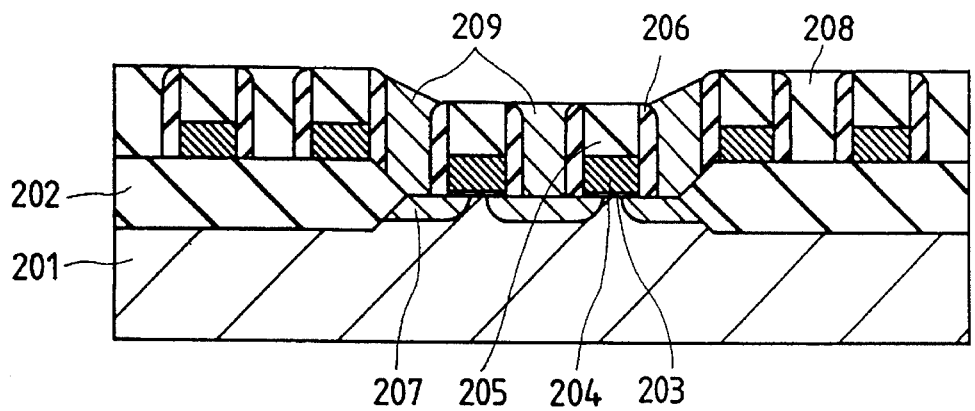
FIGS. 14a through 14e are respectively process views for describing a fifteenth example.

The same processes as those shown in FIGS. 13a through 13f are carried out so as to form a structure shown in FIG. 14a.

Figure 14B:
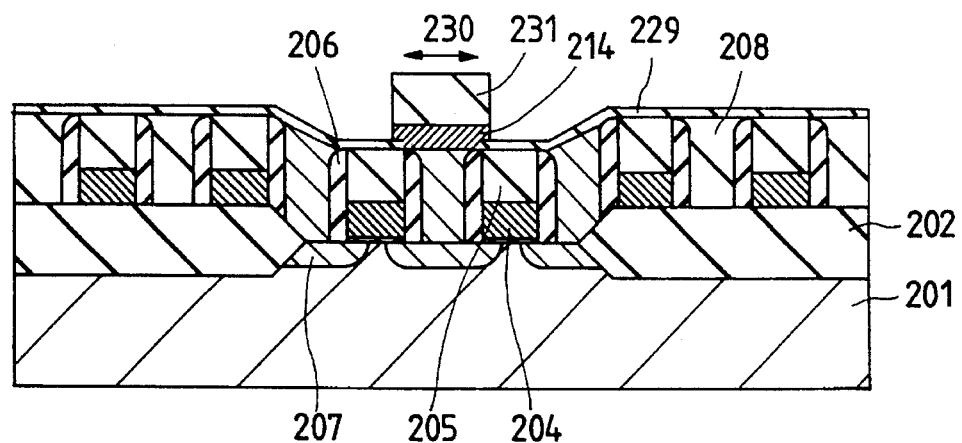

Next, an $SiO_2$ film 229 having a thickness of 30 nm is formed by the known Chemical Vapor Deposition as shown in FIG. 14b. Thereafter, resist patterns (not shown) are used as masks. In this condition, the $SiO_2$ film 229 formed on a data-line contact region 230 is etched and removed. After a data line 214 made of a polycrystalline silicon film and an $SiO_2$ film 231 have been formed by the known Chemical Vapor Deposition, unisotropic dry etching is effected using resist patterns (not shown) as masks to thereby remove unnecessary portions of the $SiO_2$ film 231 and the data line 214 and leave only the contact region 230 as it is.

Figure 14C:
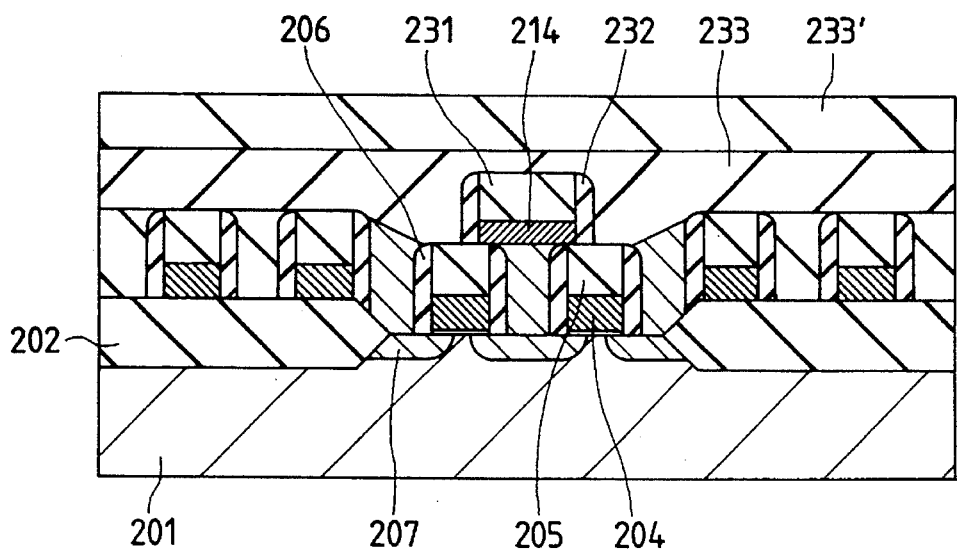

After an $SiO_2$ film having a thickness of 50 nm has been formed by the Chemical Vapor Deposition as shown in FIG. 14c, the unisotropic dry etching is performed to form side walls 232. Further, an $Si_3N_4$ film 233 having a thickness of 100 nm and an $SiO_2$ film 233' having a thickness of 250 nm are formed by the Chemical Vapor Deposition. If an $Si_3N_4$ film having a thickness of 50 nm is formed again by the Chemical Vapor Deposition after the relatively thick $Si_3N_4$ film 233 has been etched back and its surface has been made flat after the formation of the $Si_3N_4$ film 233, the average height of a memory cell can be reduced.

Figure 14D:
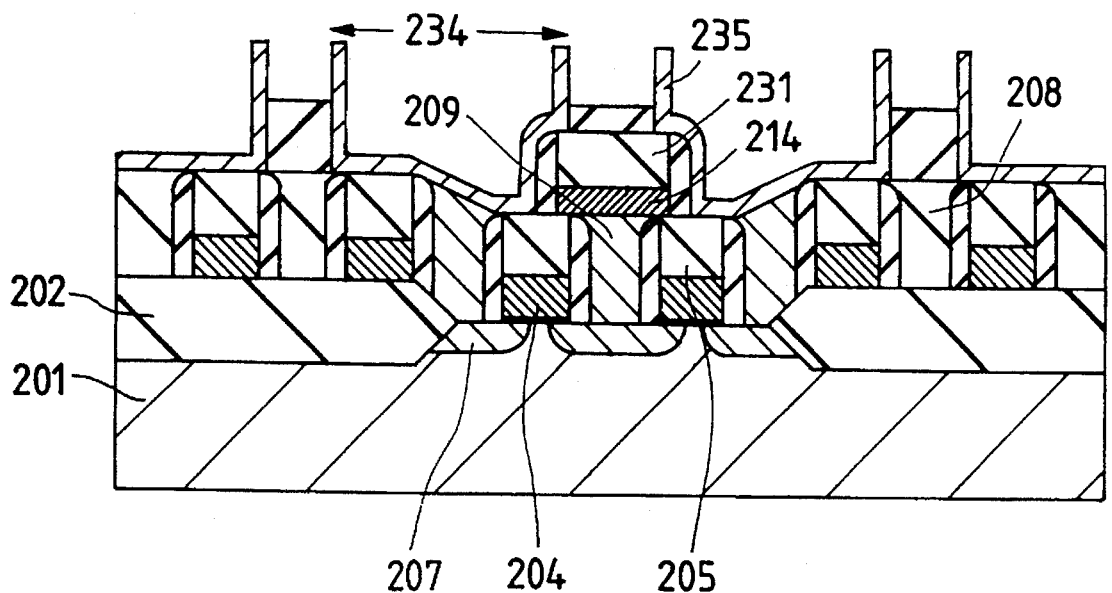

Next, each of lower electrodes of capacitors each made of a polycrystalline silicon film 235 is fabricated as shown in FIG. 14d by a method identical to that shown in the Example 11 or 12.

Figure 14E:
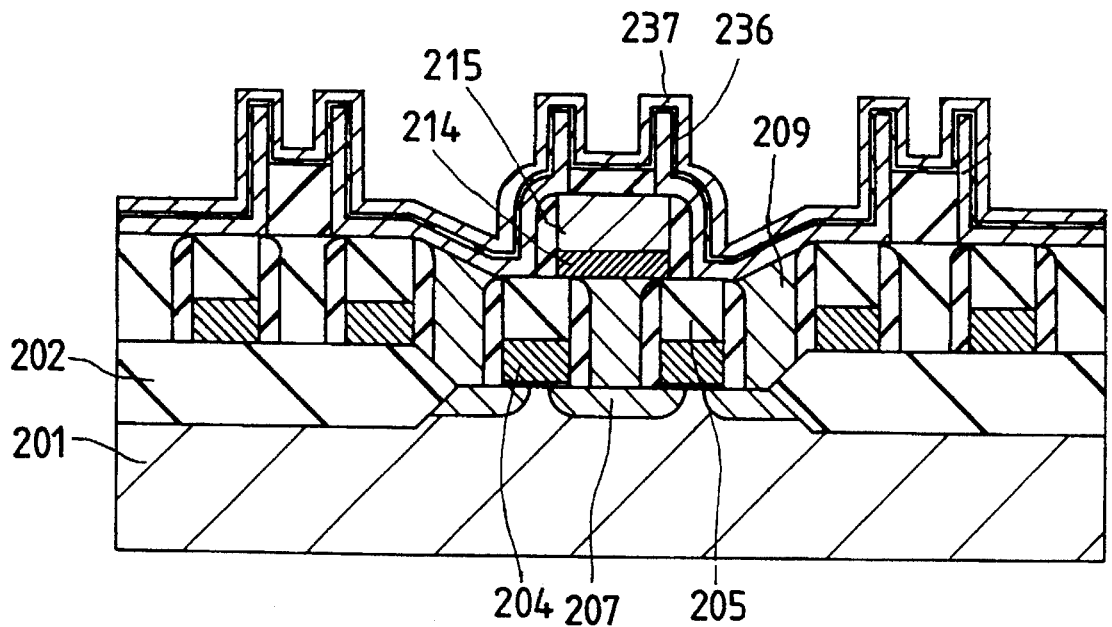

Finally, a capacitor insulator 236 made of a multi-layer film formed by stacking an $Si_3N_4$ film and an $SiO_2$ film on each other and having a 5 nm-thickness equivalent to $SiO_2$, and a plate 237 are formed so as to form memory cells each having a structure shown in FIG. 14e.

According to the present invention, as has been described above, a DRAM cell having a storage capacitance of about twice the capacitance of a conventional DRAM cell can be realized without change of the height of a capacitor. It is therefore possible to bring a semiconductor memory device into fine form and high density.

What is claimed is:

1. A semiconductor memory device wherein a plurality of memory cells each comprising a data line, a switching transistor comprised of a field effect transistor having a first impurity doped layer connected to said data line, and capacitors for charge storage connected to a second impurity doped layer of said switching transistor, are arranged in planar form, characterized in that one of pairs of memory cells comprises first and second memory cells of said plurality of memory cells, which are formed adjacent to each other along the longitudinal direction of said data line and first and second capacitors of said capacitors, which are respectively held by said first and second memory cells, are arranged planar and parallel to said data line in such a manner that one does not include the other.

2. The semiconductor memory device as claimed in claim 1, wherein said first and second capacitors for the charge storage are laid over regions for said second and first memory cells respectively.

3. The semiconductor memory device as claimed in claim 1, wherein a part of said pairs of memory cells comprises two said memory cells which unshare the use of said active regions.

4. The semiconductor memory device as claimed in claim 1, wherein said data line is disposed above said capacitors for the charge storage.

5. The semiconductor memory device as claimed in claim 1, wherein said capacitors lay over said data line.

6. The semiconductor memory device as claimed in claim 1, wherein at least parts of said capacitors are formed within grooves defined in a semiconductor substrate and said switching transistor is formed on a thin film semiconductor electrically insulated from said semiconductor substrate.

7. The semiconductor memory device as claimed in claim 1, wherein said capacitors respectively have portions each bent and formed in the form of a protrusion.

8. The semiconductor memory device as claimed in claim 7, wherein ends of said capacitors are bent upward.

9. The semiconductor memory device as claimed in claim 1, wherein said pair of memory cells are connected to a predetermined data line of the data lines and continuously disposed in the same direction as the direction in which said corresponding data extends, said first and second memory cells adjacent to each other share the use of a contact with said data line, and said first pair of memory cells and said second pair of memory cells adjacent to said first pair of memory cells are disposed so as to be deviated from each other by a length of memory cell, which extends along said data line.

10. The semiconductor memory device as claimed in claim 1, wherein the ratio of the length of the long side of said capacitor to the length of the short side thereof falls within a ratio range from over 5 to under 56.

11. A semiconductor memory device wherein a plurality of memory cells each comprising a data line, a switching transistor comprised of a field effect transistor having a first impurity doped layer connected to said data line, and capacitors for charge storage connected to a second impurity doped layer of said switching transistor, are arranged in planar form, characterized in that each of pairs of memory cells is provided so as to interpose a third memory cell between predetermined two first and second memory cells extending in the direction of intersecting said data line and at least one part of first and second capacitors for charge storage of said capacitors is disposed in parallel to said data line along the direction of intersecting said data line.

12. The semiconductor memory device as claimed in claim 11, wherein said first and second capacitors that said first and second memory cells have respectively, are laid over regions for said second and first memory cells respectively.

13. The semiconductor memory device as claimed in claim 11, wherein a part of said pairs of memory cells comprises two said memory cells which unshare the use of said active regions.

14. The semiconductor memory device as claimed in claim 11, wherein said data line is disposed above said capacitors for the charge storage.

15. The semiconductor memory device as claimed in claim 11, wherein said capacitors lay over said data line.

16. The semiconductor memory device as claimed in claim 11, wherein at least parts of said capacitors are formed within grooves defined in a semiconductor substrate and said switching transistor is formed on a thin film semiconductor electrically insulated from said semiconductor substrate.

17. The semiconductor memory device as claimed in claim 11, wherein said capacitors respectively have portions each bent and formed in the form of a protrusion.

18. The semiconductor memory device as claimed in claim 11, wherein ends of said capacitors are bent upward.

19. The semiconductor memory device as claimed in claim 11, wherein the ratio of the length of the long side of said capacitor to the length of the short side thereof falls within a ratio range from over 1 to under 56.

* * * * *